United States Patent
Halliyal et al.

(10) Patent No.: US 6,958,511 B1
(45) Date of Patent: Oct. 25, 2005

(54) FLASH MEMORY DEVICE AND METHOD OF FABRICATION THEREOF INCLUDING A BOTTOM OXIDE LAYER WITH TWO REGIONS WITH DIFFERENT CONCENTRATIONS OF NITROGEN

(75) Inventors: Arvind Halliyal, Cupertino, CA (US); Amir H. Jafarpour, Pleasanton, CA (US); Hidehiko Shiraiwa, San Jose, CA (US); Tazrien Kamal, San Jose, CA (US); Mark Ramsbey, Sunnyvale, CA (US); Jaeyong Park, Sunnyvale, CA (US)

(73) Assignee: FASL, LLC, Sunnyvale, CA (US)

( * ) Notice: Subject to any disclaimer, the term of this patent is extended or adjusted under 35 U.S.C. 154(b) by 72 days.

(21) Appl. No.: 10/679,774

(22) Filed: Oct. 6, 2003

(51) Int. Cl.[7] .................. H01L 29/76; H01L 29/788; H01L 21/8238; H01L 21/336; H01L 21/31

(52) U.S. Cl. .................. 257/314; 257/315; 438/257; 438/261; 438/775

(58) Field of Search .................. 438/257, 261, 438/775, 201, 287; 257/314, 315, 239

(56) References Cited

U.S. PATENT DOCUMENTS

| | | | |
|---|---|---|---|
| 6,127,227 A | 10/2000 | Lin et al. | 438/261 |
| 6,133,605 A | 10/2000 | Kishi | 257/325 |
| 6,362,051 B1 * | 3/2002 | Yang et al. | 438/261 |

* cited by examiner

*Primary Examiner*—William M. Brewster
(74) *Attorney, Agent, or Firm*—Renner, Otto, Boisselle & Sklar LLP

(57) ABSTRACT

Process of fabricating multi-bit charge trapping dielectric flash memory device, including forming on a semiconductor substrate a bottom oxide layer to define a substrate/oxide interface, in which the bottom oxide layer includes a first oxygen concentration and a first nitrogen concentration; and adding a quantity of nitrogen to the bottom oxide layer, whereby the bottom oxide layer includes a first region adjacent the charge storage layer and a second region adjacent the substrate/oxide interface, the second region having a second oxygen concentration and a second nitrogen concentration, in which the second nitrogen concentration exceeds the first nitrogen concentration, provided that the second nitrogen concentration does not exceed the second oxygen concentration. In one embodiment, the first nitrogen concentration is substantially zero.

19 Claims, 5 Drawing Sheets

FLASH MEMORY DEVICE AND METHOD OF FABRICATION THEREOF INCLUDING A BOTTOM OXIDE LAYER WITH TWO REGIONS WITH DIFFERENT CONCENTRATIONS OF NITROGEN

TECHNICAL FIELD

The present invention relates to semiconductor devices and the fabrication thereof and, more particularly, to a semiconductor device having a quantity of nitrogen added to a region of a dielectric layer which provides a reduced number of sites susceptible to undesirable charge trapping.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important charge storage material for EEPROM devices is a charge trapping dielectric, for example, silicon nitride in an oxide-nitride-oxide (ONO) structure. One EEPROM device that utilizes a charge trapping dielectric charge storage layer is a silicon-oxide-nitride-oxide-silicon (SONOS) type cell. In other such devices, the charge storage is in a charge trapping dielectric layer, but the materials of the various layers may vary from those used in SONOS devices. That is, the silicon, the oxide and/or the nitride of the respective layers may be replaced with another material. For example, silicon may be replaced by germanium or silicon-germanium, oxide and/or nitride may be replaced by, e.g., a high-K dielectric material. Such devices, as well as the SONOS device, are generally included within the designation "charge trapping dielectric flash memory" device, as used herein.

In charge trapping dielectric charge storage devices, during programming, electrical charge is transferred from the substrate to the charge trapping dielectric charge storage layer in the device, e.g., the nitride layer in a SONOS device. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped in the charge trapping dielectric layer. This jump is known as hot carrier injection (HCl), the hot carriers being electrons. Electrons are trapped near the drain region because the electric fields are the strongest near the drain. Reversing the potentials applied to the source and drain will cause electrons to travel along the channel in the opposite direction and be injected into the charge trapping dielectric layer near the source region. Because the charge trapping dielectric material is not electrically conductive, the charge introduced into the charge trapping dielectric layer tends to remain localized. Accordingly, depending upon the application of voltage potentials, electrical charge can be stored in discrete regions within a single continuous charge trapping dielectric charge storage layer.

Non-volatile memory designers have taken advantage of the localized nature of electron storage within a charge trapping dielectric layer and have designed memory circuits that utilize two or more regions of stored charge within the charge storage layer. This type of non-volatile memory device is known as a dual-bit or multi-bit EEPROM. A dual-bit EEPROM is available under the trademark MIRRORBIT™ from Advanced Micro Devices, Inc., Sunnyvale, Calif. The MIRRORBIT™ dual-bit EEPROM is capable of storing twice as much information as a conventional EEPROM in a memory array of equal size. A left bit and a right bit are stored in physically different areas of the silicon nitride layer, in left and right regions of each memory cell, respectively. The above-described programming methods are used to enable the two bits to be programmed and read simultaneously. Each of the two bits of the memory cell can be individually erased by applying suitable erase voltages to the gate and to either the source or drain regions. The multi-bit memory cells recently have been developed, in which more than two bits can be stored in physically separate regions of a single charge storage layer of the flash EEPROM memory cell. As used herein, the term "multi-bit" refers to both dual-bit and higher-bit memory cells, unless otherwise specifically stated.

While the recent advances in EEPROM technology have enabled memory designers to double the memory capacity of EEPROM arrays using dual-bit data storage, numerous challenges exist in the fabrication of material layers within these devices.

In particular, the bottom oxide layer of the ONO structure must be carefully fabricated so that it is resistant to hot carrier stress and charge trapping. When the bottom oxide layer is formed, silicon-hydrogen bonds and/or dangling silicon bonds may exist at the interface between the substrate, e.g., the Si wafer, and the bottom oxide layer of the ONO structure, e.g., a $SiO_2$ or other oxide-containing dielectric material, such as a high-K dielectric material, layer. The energy produced by HCl stress may be sufficient to break the silicon-hydrogen bonds, thereby causing device degradation (e.g. V+shift, drain current reduction, etc.). The dangling silicon bonds thus produced, and any such bonds previously existing, create charge trapping sites in the bottom oxide layer near or adjacent to the substrate/oxide interface. When such voltages are used, channel carriers can be sufficiently energetic to enter an insulating layer and degrade device behavior. For example, in silicon-based P-channel MOSFETs, channel strength can be reduced by trapped energetic holes in the oxide which lead to a positive oxide charge near the drain. On the other hand, in N-channel MOSFETs, gate-to-drain shorts may be caused by electrons entering the oxide and creating interface traps and oxide wear-out. Accordingly, advances in ONO fabrication technology are needed to eliminate or remove hydrogen bonding between the Si wafer and ONO structures used, for example, in charge trapping dielectric charge storage devices, such as the MIRRORBIT™ EEPROM device.

DISCLOSURE OF THE INVENTION

The present invention, in one embodiment, relates to a process of fabricating a multi-bit charge trapping dielectric flash memory device, including providing a semiconductor substrate; forming on the semiconductor substrate a bottom oxide layer and a substrate/oxide interface, wherein the bottom oxide layer comprises a first oxygen concentration and a first nitrogen concentration; and adding a quantity of nitrogen to the bottom oxide layer, whereby the bottom oxide layer comprises a first region adjacent the charge storage layer and a second region adjacent the substrate/oxide interface, the second region having a second oxygen concentration and a second nitrogen concentration, wherein the second nitrogen concentration exceeds the first nitrogen concentration, provided that the second nitrogen concentration does not exceed the second oxygen concentration. In one embodiment, the first nitrogen concentration is substantially zero.

In another embodiment, the present invention relates to a process of fabricating a multi-bit charge trapping dielectric flash memory device, including providing a semiconductor substrate; forming on the semiconductor substrate a bottom oxide layer and a substrate/oxide interface, wherein the bottom oxide layer comprises a material having a general formula $Si_xO_yN_{z1}$, wherein x, y and z1 are atomic percentages; and adding a quantity of nitrogen to the bottom oxide layer, whereby the bottom oxide layer comprises a first region adjacent the charge storage layer and a second region adjacent the substrate/oxide interface, whereby the second region comprises a material having a general formula $Si_xO_yN_{z2}$, wherein x, y and z2 are atomic percentages, and $y>z2>z1$. In one embodiment, z1 is substantially equal to zero.

In another embodiment, the present invention relates to a charge trapping dielectric flash memory device, including a semiconductor substrate having an upper surface; a bottom oxide layer having a lower surface, the bottom oxide layer formed on the upper surface of the substrate, whereby a substrate/oxide interface is defined by the upper surface and the lower surface; and a charge trapping dielectric charge storage layer over the bottom oxide layer, wherein the bottom oxide layer comprises a first region adjacent the charge storage layer and a second region adjacent the substrate/oxide interface, the first region comprising a material having a general formula $Si_xO_yN_{z1}$, the second region comprising a material having a general formula $Si_xO_yN_{z2}$, wherein x, y, z1 and z2 are atomic percentages, and $y>z2>z1$. In one embodiment, z1 is substantially equal to zero.

Thus, the present invention provides a solution to problems such as charge loss, dielectric reliability and hot carrier injection induced stress at the interface between a substrate and an overlying oxide layer due to the presence of either or both of silicon-hydrogen bonds which can be converted to dangling silicon bonds, and dangling silicon bonds.

Figure 1:
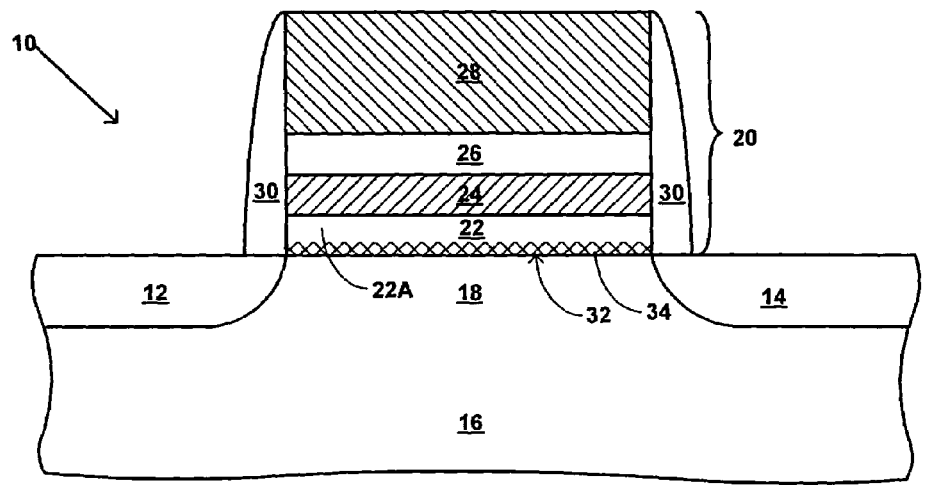
FIG. 1 illustrates a portion of a semiconductor substrate containing a two-bit EEPROM transistor which incorporates a bottom oxide layer fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

MODES FOR CARRYING OUT THE INVENTION

It should be appreciated that while the present invention is described in terms of a charge trapping dielectric charge storage flash memory device, the present invention is not limited to such device, and is applicable to a broad range of semiconductor devices and their fabrication processes. Generally speaking the semiconductor devices will include at least one active component therein, for example a diode, transistor, thyristor or the like. Illustrative examples include MOS-based devices such as MOSFET devices, including CMOS and NMOS technology, light-emitting diodes, laser diodes, and the like. In this regard, the MOS-based technology discussed herein is intended to encompass the use of gate conductors other than metals as is commonly practiced, and thus reference to MOS-based devices encompasses other insulated gate technologies (e.g. IGFETs). While aspects of the present invention will now be described in more detail with reference to a charge trapping dielectric charge storage flash memory device, it will be understood that the invention is applicable to the above-mentioned and other semiconductor devices which are susceptible to aging due to hot-carrier effects and generally the effects of energetic charge carriers.

Turning now to FIG. 1, there is schematically shown in cross-section a transistor 10 suitable for use in a dual-bit or multi-bit charge trapping dielectric flash memory device, e.g., a dual-bit EEPROM such as the MIRRORBIT™, in accordance with an embodiment of the present invention. The transistor 10 includes source/drain regions 12 and 14 located in a semiconductor substrate 16 and separated by a channel region 18. A gate stack 20 overlies the channel region 18. The gate stack 20 may also be referred to as a stacked-gate structure, or as a stack gate. The gate stack 20 is indicated by the bracket in FIG. 1. The gate stack 20 comprises, from bottom to top, a bottom oxide layer 22, a charge trapping dielectric charge storage layer 24, a top oxide layer 26 and a control gate electrode 28. Together, the bottom oxide 22, the charge trapping dielectric charge storage layer 24 and the top oxide layer 26 form a structure which may be referred to as an ONO structure, although the material of which the respective layers are formed may differ from the conventional ONO structure components, silicon dioxide (O), silicon nitride (N) and silicon dioxide (O), respectively. Thus, in one embodiment, the charge storage layer 24 comprises silicon nitride. Other suitable charge trapping dielectric charge storage materials may be used for the charge storage layer 24, for example, suitable high-K dielectric materials may be used in the charge trapping dielectric charge storage layer 24. In some embodiments, the silicon dioxide in either of the O layers may be replaced by a high-K or a composite dielectric material. Further details on such materials are provided below.

Referring still to FIG. 1, isolation sidewalls 30 are formed on both sides of the gate stack 20. The isolation sidewalls 30 may be formed of any suitable material known in the art for such use, such as silicon nitride or a high-K dielectric material. The isolation sidewalls 30 may be formed by any suitable process known in the art.

In one embodiment, a thin layer of silicon dioxide, or other suitable material (not shown), is formed between the isolation sidewalls 30 and the gate stack 20. In one embodiment, the thin layer of silicon dioxide or other material is formed or deposited over the surface of the entire gate stack 20 and the semiconductor substrate, prior to formation of the layers from which the isolation sidewalls 30 are formed.

Referring still to FIG. 1, a substrate/oxide interface 32 is defined between the upper surface of the substrate 16 and the lower surface of the bottom oxide layer 22. The substrate/oxide interface 32 is described in further detail below.

Referring still to FIG. 1, the bottom oxide layer 22 includes two regions, a first, upper region 22A and a second, lower region 34. The second region 34 is adjacent the substrate/oxide interface 32. In both regions, the bottom oxide layer 22 is primarily formed of an oxide material. The oxide material may be, for example, silicon dioxide, $SiO_2$. In accordance with the present invention, the second region 34 comprises a quantity of nitrogen, which is less than the quantity of oxygen in the second region 34, but which is sufficient to avoid at least some problems such as charge loss, dielectric reliability and HCl induced stress which might otherwise occur at the interface 32 and in the bottom oxide layer 22.

In the following discussion of concentrations and/or contents, for all materials such as silicon, oxygen and nitrogen, and throughout the present disclosure and claims, the concentration or content is based on atomic percentages of the material as a whole.

In one embodiment, the bottom oxide layer 22 includes the first, upper region 22A adjacent the charge storage layer 24, in which the first upper region 22A includes a first oxygen concentration and a first nitrogen concentration. In this embodiment, the bottom oxide layer 22 further includes the second, lower region 34 adjacent the substrate/oxide interface 32, in which the second region 34 has a second oxygen concentration and a second nitrogen concentration. In accordance with the present invention, the second nitrogen concentration exceeds the first nitrogen concentration, and the second nitrogen concentration does not exceed the second oxygen concentration. In other words, the nitrogen content of the second, lower region 34 is higher than the nitrogen content of the first, upper region 22A of the bottom oxide layer 22. In one embodiment, the nitrogen content of the first, upper region 22A is substantially zero. In addition, the nitrogen content in the second, lower region 34, is always lower than the oxygen content in the second, lower region 34. In one embodiment, the nitrogen content of the second, lower region 34 ranges from about 1 atomic percent to about 20 atomic percent. In another embodiment, the nitrogen content of the second, lower region 34 ranges from about 2 atomic percent to about 10 atomic percent, and in another embodiment, from about 3 to about 7 atomic percent.

In the foregoing ranges, and throughout the specification and claims, the numerical limits of all ranges and ratios and ratios may be combined. Thus, for example, although in the foregoing ranges of nitrogen content a range of about 1 to about 7 atomic percent is not specifically recited, this range is within the scope of the disclosure.

In one embodiment, the bottom oxide layer 22 includes the first, upper region 22A adjacent the charge storage layer 24 and the second, lower region 34 adjacent the substrate/oxide interface 32, in which the first region 22A includes a material having a general formula $Si_xO_yN_{z1}$, the second region 34 includes a material having a general formula $Si_xO_yN_{z2}$, in which x, y, z1 and z2 are atomic percentages, and y>z2>z1. In one embodiment, z1 is in a range from zero to less than one atomic percent. The foregoing relationship corresponds to the above description, in which the nitrogen content of the second region 34 exceeds that of the first region 22A, and in which the nitrogen content of the second region 34 does not exceed the oxygen content of the second region 34. In one embodiment, z2 is in the range from about one atomic percent to about 20 atomic percent. In one embodiment, z1 is in a range from zero to less than one atomic percent. In one embodiment, z1 is in a range from zero to about 20 atomic percent, but is less than z2.

In one embodiment, the charge trapping dielectric material of the charge storage layer 24 includes a nitride, such as silicon nitride, or a high-K dielectric material, such as one of the high-K materials disclosed below, or a mixture of composite thereof. In one embodiment, either or both of the top oxide layer 26 or the bottom oxide layer 22 includes silicon dioxide or a high-K dielectric material, such as one of the high-K dielectric materials disclosed below, or a mixture or composite of such materials.

The thickness of the second, lower region 34 may range from a small fraction of the total thickness of the bottom oxide layer 22, to at least 50% of the total thickness of the bottom oxide layer 22. In one embodiment, of the total thickness of the bottom oxide layer 22, the second region 34 has a thickness equivalent to about 10% to about 50% of the total thickness of the bottom oxide layer. Thus, in this embodiment, the first, upper region 22A has a thickness in a range from about 90% to about 50% of the total thickness of the bottom oxide layer 22. In another embodiment, of the total thickness of the bottom oxide layer 22, the second region 34 has a thickness equivalent to about 20% to about 80% of the total thickness of the bottom oxide layer. Thus, in this embodiment, the first, upper region 22A has a thickness in a range from about 80% to about 20% of the total thickness of the bottom oxide layer 22.

In the operation of the exemplary dual-bit EEPROM transistor 10, voltages are applied to the gate electrode 28 and as appropriate to the source/drain regions 12 and 14. The applied voltages cause electrical charge from the source/drain regions 12 and 14 to propagate across the channel region 18. During programming, once the charge encounters a sufficiently strong vertical field, the charge either is injected or tunnels from the channel region 18 through the bottom oxide layer 22 into the charge storage layer 24. The charge storage layer 24 may also be referred to as an electron storage layer. For example, depending upon the particular voltage levels applied to the control-gate electrode 28 and to the source/drain regions 12 and 14, the electrical charges are transferred into the charge storage layer 24 and are localized to physically separate regions in proximity to either the source/drain region 12, or the source/drain region 14.

Those skilled in the art will recognize that for proper functioning of a charge trapping dielectric flash memory device such as the device 10, the electrical charges should remain isolated in the physically separate regions of the charge storage layer 24 to which each charge is initially introduced. The proper maintenance of the electrical charges in localized regions of the charge storage layer 24 is needed for the proper performance of a dual-bit EEPROM device. Similarly, in a multi-bit EEPROM device, proper maintenance of the electrical charges in localized regions of the charge storage layer 24 is needed. In particular, the quality of the substrate/oxide interface 32 should be such that dangling silicon bonds and/or silicon-hydrogen bonds to not create either charge trapping sites or charge leakage paths through the bottom oxide layer 22 and into the channel region 18 in the substrate 16, or at least of a quality such that charge trapping sites or charge leakage paths should be minimized. The present inventors have discovered that by providing an optimal concentration of nitrogen in the second, lower region 34 of the bottom oxide layer 22, as described above, such charge trapping sites and/or charge leakage paths can be significantly reduced or eliminated from the region 34 of the bottom oxide layer 22 adjacent the substrate/oxide interface 32.

The present invention may be applicable generally to any device having an interface between a substrate, e.g., silicon, and an overlying oxide layer, e.g., silicon dioxide or a high-K metal oxide, in which silicon-hydrogen bonds or dangling silicon bonds may be present and may be undesirable, for reasons such as an adverse affect on performance of the interface and/or the device of which the interface is a component.

Figure 2:
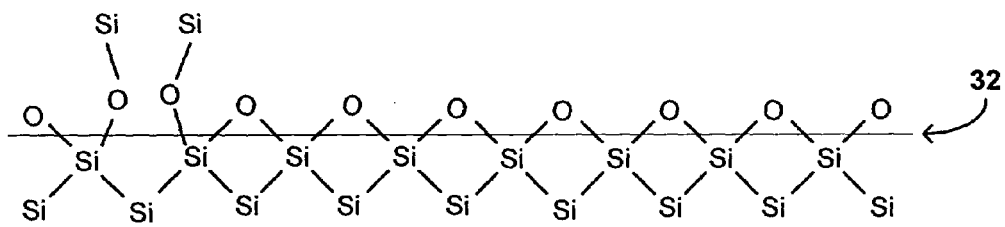
FIGS. 2–4 are schematic diagrams of an interface between a substrate and an overlying oxide layer, in accordance with an embodiment of the present invention.
Figure 3:
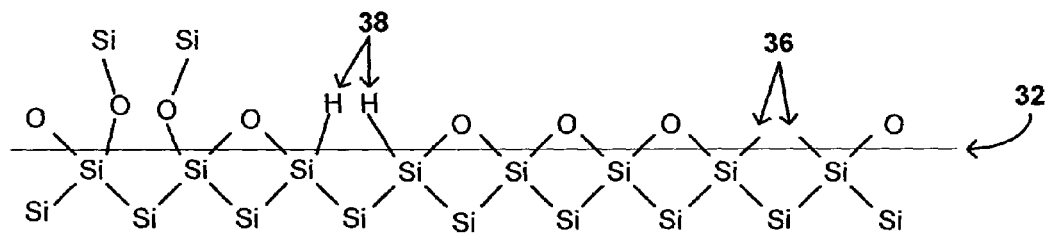
Figure 4:
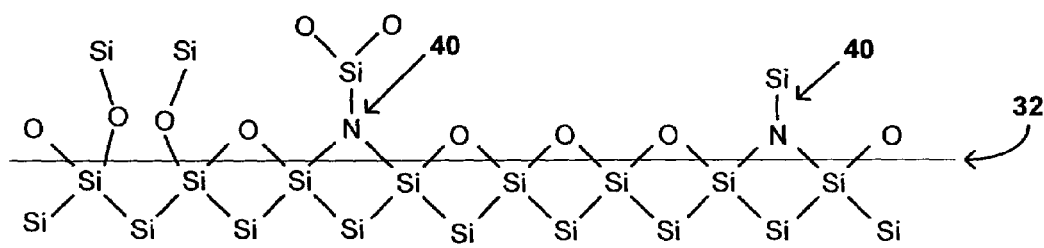

FIGS. 2–4 are highly schematic diagrams showing exemplary substrate/oxide interfaces 32 between a silicon substrate 16 and a silicon dioxide layer, e.g., a bottom oxide layer 22, formed on the silicon substrate 16. Those of skill in the art will recognize that the depiction of the interface 32 shown in FIGS. 2–4 is highly schematic and is presented here for exemplary purposes only, and not for any limiting purpose. FIGS. 2–4 are provided only to illustrate the type of bonds and structures with which the present invention is concerned.

FIG. 2 is a schematic diagram of an "ideal" interface 32 between a silicon substrate and an overlying oxide layer, in which there are no silicon-hydrogen bonds and no dangling silicon bonds. Such an ideal interface is rarely achieved in practice due, for example, to the many variables involved in formation of such an interface. It is noted that, in accordance with the highly schematic and exemplary nature of these diagrams, rather than the Si—O—Si bonds shown in which both Si atoms are in the substrate, it may be more common in an actual substrate-oxide interface that the Si—O—Si bonds at the interface 32 may comprise one Si atom from the substrate and one Si atom from the silicon dioxide bottom oxide layer 22, as shown schematically in the left-hand side of FIG. 2.

FIG. 3 is a schematic diagram of an interface 32 between a silicon substrate and an overlying oxide layer which includes both dangling silicon bonds 36 and silicon-hydrogen bonds 38. As described above, such silicon-hydrogen bonds 38 are easily cleaved to form dangling silicon bonds 36. As described above, dangling silicon bonds 36 act as traps for electrons being injected or transferred from the channel region 18 past the interface 32, through the bottom oxide layer 22 and into the charge storage layer 24.

FIG. 4 is a schematic diagram of an interface 32 after the method of the present invention has been carried out on the interface 32 shown in FIG. 3. As shown in FIG. 4, the silicon-hydrogen bonds 38 have been replaced by silicon-nitrogen bonds 40, and the dangling silicon bonds 36 have been replaced by silicon-nitrogen bonds 40. The interface 32 shown in FIG. 4 is one which is merely exemplary of two embodiments of the present invention, and is not intended to be limiting in any way. To wit, in an embodiment of the present invention in which there is a single silicon-hydrogen bond 38 or single dangling silicon bond 36, rather than two neighboring bonds as shown in FIG. 3, the nitrogen which is added may form a different set of bonds to adjacent atoms than that depicted in FIG. 4.

In accordance with the invention, silicon-hydrogen bonds and dangling silicon bonds are replaced with stronger bonds to nitrogen, formed by a reaction between silicon and nitrogen, thereby making the device more resistant to HCl-induced degradation, charge trapping and/or charge leakage at the interface 32. The improved device performance obtained by the present invention can be better understood following a description of processes carried out in accordance with the invention.

Figure 12:
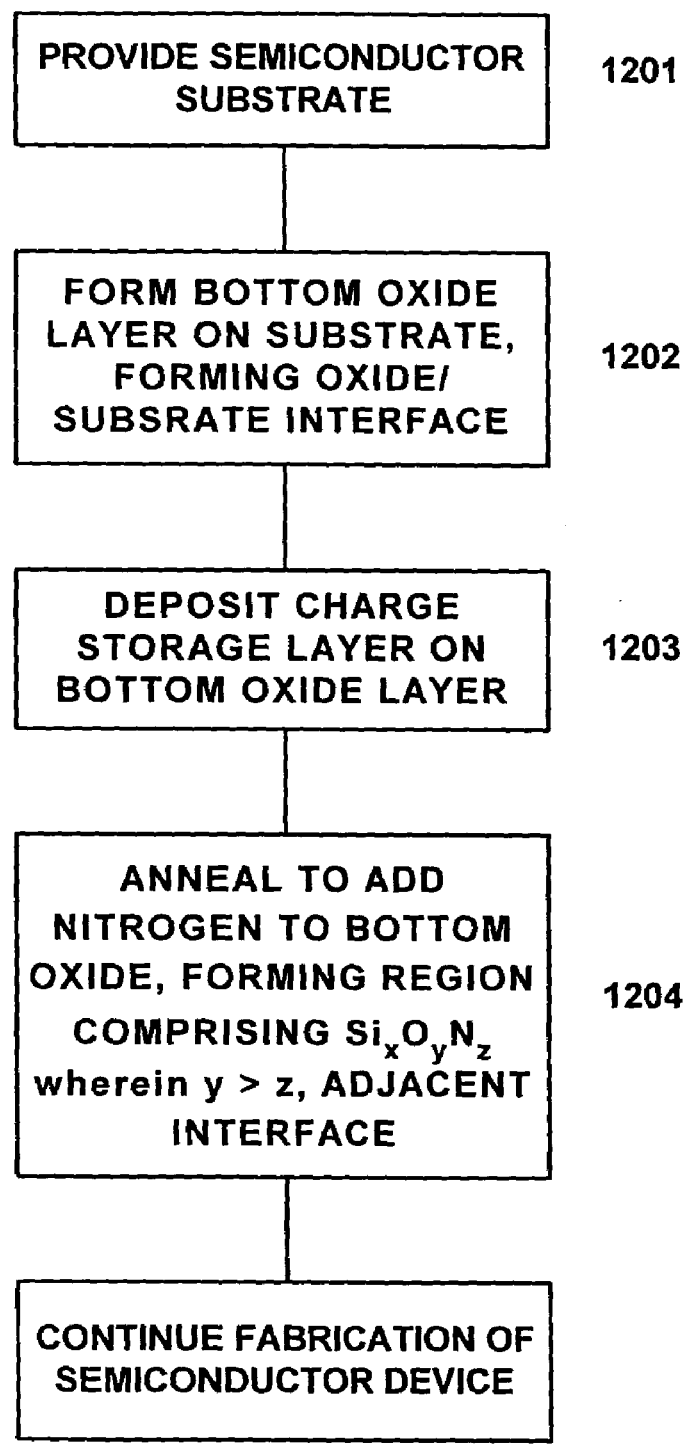
FIG. 12 is a schematic flow diagram generally illustrating steps of one embodiment of the present invention.
Figure 13:
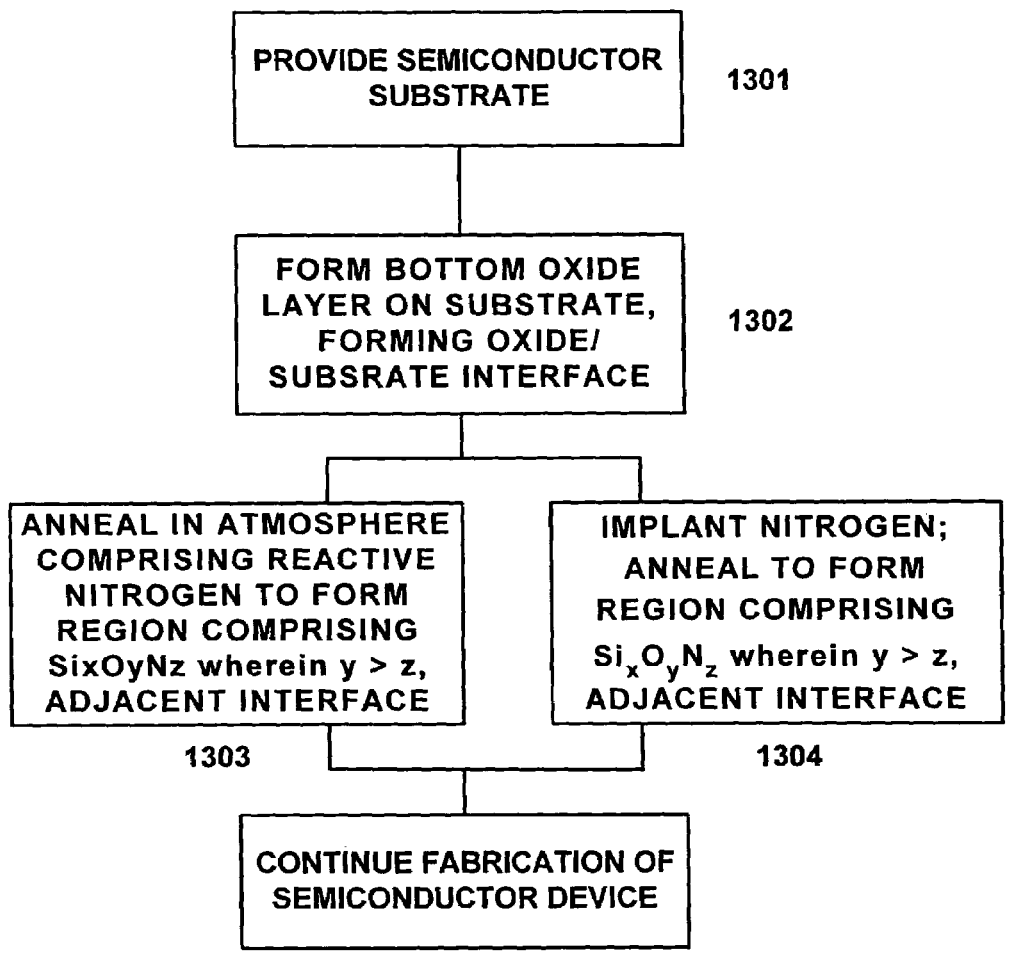
FIG. 13 is a schematic flow diagram generally illustrating steps of additional embodiments of the present invention.

The following description of the present invention follows with reference to FIGS. 5–13. FIGS. 5–11 illustrate, in cross-section, process steps for two embodiments of the fabrication of a bottom oxide layer, in accordance with the invention. FIGS. 12 and 13 are schematic flow diagrams generally illustrating steps of processes in accordance with the present invention.

The first and second steps of both embodiments are the same. In the first step of the present invention, shown schematically in FIG. 12 as step 1201 and in FIG. 13 as step 1301, a semiconductor substrate is provided. The semiconductor substrate can be any appropriately selected semiconductor substrate known in the art. For example, the semiconductor substrate can be a bulk silicon substrate, a silicon-on-insulator semiconductor substrate, a p-doped silicon substrate. Suitable semiconductor substrates include, for example, bulk silicon semiconductor substrates, silicon-on-insulator (SOI) semiconductor substrates, germanium-on-insulator (GOI), silicon-on-sapphire (SOS) semiconductor substrates, and semiconductor substrates formed of other materials known in the art. The present invention is not limited to any particular type of semiconductor substrate.

Figure 5:
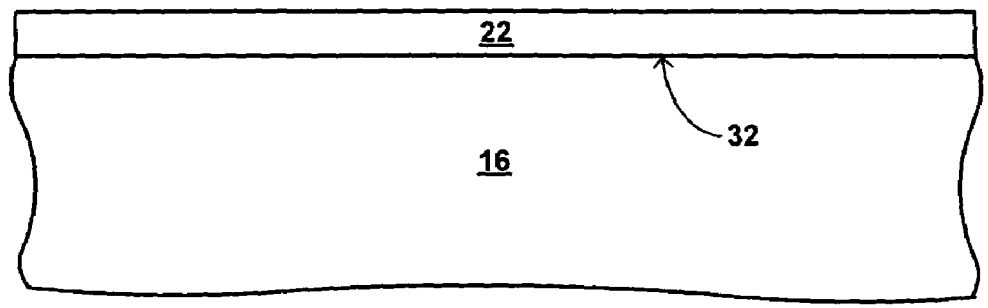
FIGS. 5–11 illustrate, in cross-section, process steps for the fabrication of a multi-bit charge trapping dielectric flash memory device in accordance with two embodiments of the invention.
Figure 8:
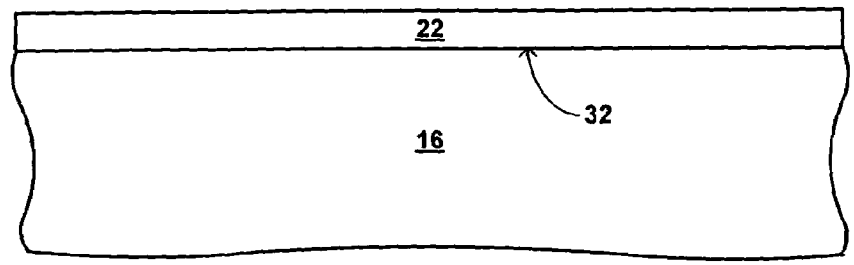

In the second step of both embodiments of the present invention, shown schematically in FIG. 12 as step 1202 and in FIG. 13 as step 1302, a bottom oxide layer 22 is formed on the upper surface of the substrate 16, forming or defining an oxide/substrate interface 32. FIGS. 5 and 8 schematically depict the bottom oxide layer 22 formed on the semiconductor substrate 16. The lower surface of the bottom oxide layer 22, and the upper surface of the semiconductor substrate 16, together define the oxide/substrate interface 32. The interface 32 shown in FIGS. 5 and 8 corresponds to the interface 32 shown in FIGS. 2–4. As noted above, although ideally the embodiment shown in FIG. 2 would be formed, in practice this is seldom the case. The present invention is particularly applicable to an embodiment such as that shown in FIG. 3. As a result of the process of the present invention, an embodiment such as that shown in FIG. 4 may be obtained.

In one embodiment, the bottom oxide layer 22 is silicon dioxide. As suggested by its name, the bottom oxide layer 22 generally comprises an oxide. However, it will be appreciated by those skilled in the art that the bottom oxide layer 22 is not limited to silicon dioxide. In one embodiment, the bottom oxide layer 22 comprises a high-K dielectric material, a composite dielectric material, or another dielectric material substantially free of any high-K dielectric material. As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 10 or more. In addition, the high-K dielectric materials include, for example, composite dielectric materials, as defined below. In one embodiment, the bottom oxide layer 22 comprises aluminum oxide, $Al_2O_3$.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate can be used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric materials. A composite dielectric material generally has a K value greater than 10, as defined above for a high-K dielectric material. A composite dielectric material may be, for example, a mixed-metal oxide, a metal silicate, a metal aluminate or a metal mixed-aluminate/silicate. Composite dielectric materials include materials such as hafnium silicate, which has a K of about 14, and hafnium silicon oxynitride, which has a K of about 16, depending on the relative content of oxygen and nitrogen, and hafnium silicon nitride, which has a K of about 18. In another example, using hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than that of silicon dioxide may be suitable. For example, the mixed-metal oxide, metal silicate, metal aluminate or metal mixed-aluminate/silicate is suitably one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

The bottom oxide layer 22 may be formed by any appropriate method known in the art for forming such layer. In one embodiment, the bottom oxide layer 22 is formed by oxidation of the surface of the semiconductor substrate 16. The oxidation is suitably carried out by any appropriate oxidation process known in the art for forming a silicon dioxide bottom oxide by oxidation of a silicon surface, such as in a rapid thermal process (RTP) apparatus of any type known in the art. For example, the RTP apparatus can be part of a single-wafer cluster tool. The oxidation of the silicon surface can be carried out by placing a wafer in the RTP apparatus and flowing oxygen-containing gas, together with other appropriate gases, into the chamber at suitable flow rates and pressure. The temperature of the RTP can be in the range from about 800° C. to about 1100° C. The flow rates and temperature are suitably selected to provide rapid oxidation of the silicon surface, to form an oxide layer of desired thickness. The oxygen-containing gas can be, for example, oxygen gas $O_2$ or nitrous oxide $N_2O$. The oxidation of the silicon surface suitably continues for a period sufficient to provide a desired thickness of the bottom oxide layer 22. Such period can range from about 5 seconds to about 500 seconds. In one embodiment, the oxidation continues for a period from about 30 to about 120 seconds.

In one embodiment, the bottom oxide layer 22 is formed by thermally oxidizing the silicon surface 36 at an elevated temperature in the presence of dry molecular oxygen. The thermal oxidation is suitably carried out at a temperature in the range of about 600° C. to about 900° C. and can be carried out in either a batch-type thermal oxidation furnace, or alternatively, in a single-wafer oxidation apparatus.

In another embodiment, the step of forming the bottom oxide layer 22 is carried out by rapid thermal oxidation (RTO) at a temperature of about 1100° C. in an oxidizing atmosphere. The bottom oxide layer 22 is suitably grown by RTO of the silicon surface of the substrate 16 at an elevated temperature in the presence of dry molecular oxygen. For example, the thermal oxidation is suitably carried out in one embodiment at a temperature in the range of about 1050° C. to about 1150° C., and in one embodiment, from about 1075° C. to about 1125° C. The oxygen content in the apparatus suitably ranges from about 1 to about 20 volume percent.

In one embodiment, the bottom oxide layer 22 is formed by a deposition process, such as a rapid-thermal-chemical-vapor-deposition (RTCVD) process. The bottom oxide layer 22 can also be formed by depositing the oxide in a batch furnace by a low-pressure-chemical-vapor-deposition (LPCVD) process. In one embodiment, the bottom oxide layer 22 is deposited by another suitable method, such as PECVD, ALD (ALCVD), PLD, MLD or MOCVD. The CVD method may be any appropriate CVD method known in the art. In other embodiments, other known methods may be used for depositing the bottom oxide layer 22.

In one embodiment, the bottom oxide layer is formed by an ISSG oxidation as described below with respect to the top oxide layer 26.

In one embodiment, the bottom oxide layer 22 is formed to have a thickness of from about 20 to about 150 angstroms. In one embodiment, the bottom oxide layer 22 has a thickness of about 100 angstroms.

As a result of the foregoing step 1202 or 1302, by an appropriate method, the bottom oxide layer 22 is formed. For embodiments where the substrate 16 comprises silicon and the bottom oxide layer 22 is $SiO_2$, the interface 32 may comprise Si—$SiO_2$, silicon dangling bonds and Si—H bonds. For embodiments in which any high-K dielectric material is used as the bottom oxide layer 22, the interface 32 may comprise corresponding silicon-metal oxide bonds, Si—H bonds and dangling silicon bonds.

Nitrogen Addition Subsequent to Charge Storage Layer Formation.

In the next step of the process in accordance with one embodiment of the present invention, shown schematically in FIG. 12 as step 1203, a nitrogen-containing charge trapping dielectric charge storage layer 24 is formed on the bottom oxide layer 22. In one embodiment, the charge storage layer 24 comprises a nitride, and in one embodiment, the nitride is silicon nitride. The nitrogen-containing charge storage layer 24 includes a form of nitrogen capable of migrating under annealing conditions from the charge storage layer 24 into the bottom oxide layer 22. A schematic illustration of the structure formed by this step is depicted in FIG. 6.

Figure 6:
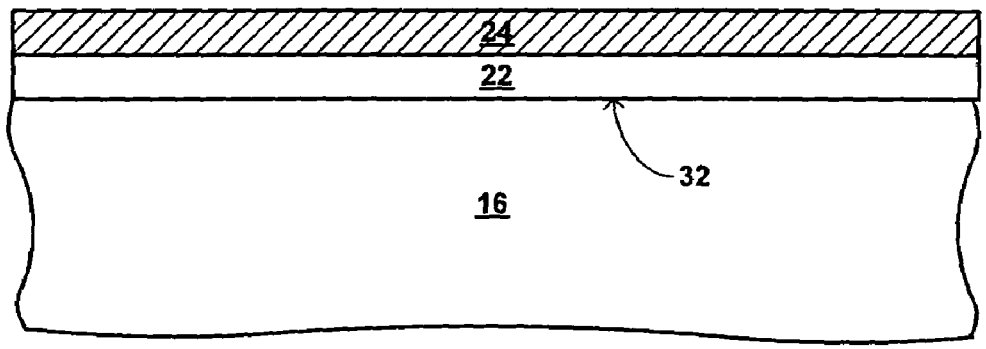
Figure 7:
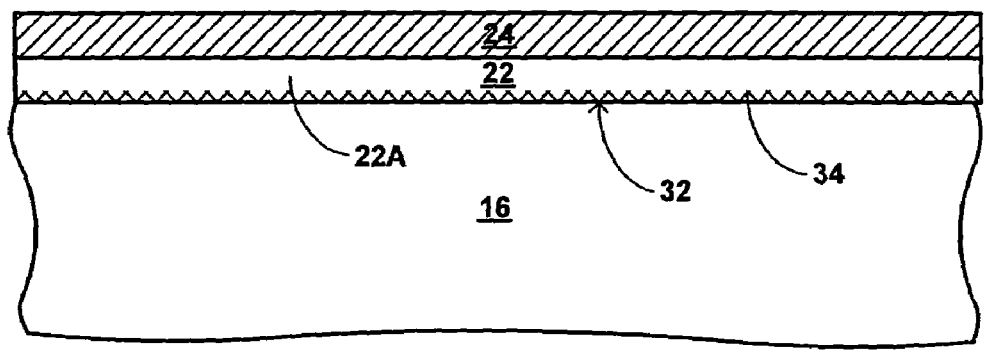

As shown in FIG. 6, after forming the bottom oxide layer 22, the nitrogen-containing charge storage layer 24 is deposited on the bottom oxide layer 22. In one embodiment, the charge storage layer 24 comprises silicon nitride. In another embodiment, the nitrogen-containing charge storage layer comprises a suitable high-K dielectric material. In another embodiment, the nitrogen-containing charge storage layer 24 comprises both a high-K dielectric material and a standard-K dielectric material, such as silicon nitride. In one embodiment, the nitrogen-containing charge storage layer 24 comprises a composite dielectric material, which comprises a composite or a reaction product of two or more dielectric materials, one of which is a high-K dielectric material and the other of which may be a standard-K dielectric material such as silicon nitride. Thus, in one embodiment, the high-K dielectric material completely replaces silicon nitride in the charge storage layer 24. In another embodiment, the high-K dielectric material is, in essence, added to or combined with, silicon nitride to form a charge storage layer 24. In another embodiment, the charge storage layer 24 includes a composite dielectric material which replaces silicon nitride.

Suitable high-K dielectric materials for use in a high-K charge storage layer are disclosed in copending U.S. application Ser. No. 10/036,757, filed Dec. 31, 2001, which is incorporated herein by reference for its disclosure relating to high-K dielectric materials for use in a charge storage layer of an ONO structure. Suitable methods for deposition of a high-K dielectric material layer include RTCVD carried out at a temperature of about 400° C. to about 800° C. The high-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$).

In one embodiment, the high-K dielectric material included in the nitrogen-containing charge trapping dielectric charge storage layer 24 may be any of the high-K materials disclosed above with respect to the bottom oxide layer 22.

With respect to embodiments in which the charge storage layer 24 comprises materials other than a nitride, herein the combined ONO structure, including the charge storage layer 24 and the two oxide layers 22, 26 between which it is sandwiched, is referred to as an ONO structure, even though the "N" layer may be other than a nitride, and either or both of the "O" layers may be an oxide other than silicon dioxide.

In one embodiment, the charge storage layer 24 is silicon nitride formed by means of a RTCVD process. In one embodiment, the RTCVD process is carried out at a temperature of about 700° C. to about 800° C. The silicon nitride material may be formed by reacting a suitable nitrogen-containing gas, e.g., ammonia ($NH_3$) with a suitable silicon-containing gas, e.g., dichlorosilane ($SiCl_2H_2$) or silane ($SiH_4$). In one embodiment, the process is carried out for a period of time and at gas flow rates sufficient to form a silicon nitride layer having a thickness of about 50 to about 200 angstroms. In another embodiment, the process is carried out for a period of time and at gas flow rates sufficient to form a silicon nitride layer having a thickness of about 100 angstroms.

In another embodiment, the charge storage layer 24 is silicon nitride formed by means of a LPCVD process. In this alternative embodiment, the silicon nitride can be formed in a batch deposition apparatus. In one embodiment, the LPCVD process is carried out at an absolute pressure of about 200 to about 500 millitorr (mtorr), at temperatures of about 700–800° C. using ammonia and either dichlorosilane or silane gas.

The nitrogen-containing charge storage layer 24 may also be deposited by other suitable methods known in the art.

Following deposition of the nitrogen-containing charge storage layer 24 of form an ON layer or structure, in the next step of the process in accordance with this embodiment of the present invention, shown schematically in FIG. 12 as step 1204, the ON layer is annealed to force nitrogen from the charge storage layer 24 into the bottom oxide layer 22. In one embodiment, the annealing is carried out at a temperature in the range from about 400° C. to about 1150° C. In one embodiment, the annealing is carried out at a temperature in the range from about 600° C. to about 1050° C. In another embodiment, the annealing is carried out at a temperature in the range from about 800° C. to about 1000° C.

In one embodiment, the annealing is carried out in an inert gas atmosphere, in which the inert gas includes one or more of $N_2$, He, Ne, Ar, Kr, Xe or Rn.

In one embodiment, the annealing conditions are similar to a rapid thermal anneal. In one embodiment of step 1204, in the annealing, a RTA is performed for a period ranging from about 5 seconds to about 5 minutes, and in one embodiment, for a period ranging from about 15 seconds to about 60 seconds. In one embodiment, the anneal is performed in a furnace for a period ranging from about 1 minute to about 3 hours, and in one embodiment, for a period ranging from about 30 minutes to about 1 hour.

In one embodiment of step 1204, during annealing, the pressure may range from about 1 torr to about 2000 torr. In one embodiment, the pressure is about 760 torr. In one embodiment, the pressure ranges from about 1 torr to about 300 torr. In one embodiment, the pressure is greater than about 760 torr.

In one embodiment, the annealing step 1204 is repeated at least one additional time, and in one embodiment, the annealing step is repeated from two to about five times, as deemed necessary.

The temperature, pressure and time period ranges needed to complete the adding step may vary depending on the properties of the bottom oxide layer, such as its chemical content and its thickness.

As a result of the step of adding nitrogen, by annealing the nitrogen-containing charge storage layer 24 and the bottom oxide layer 22, in one embodiment, the bottom oxide layer 22 comprises a first, upper region 22A adjacent the charge storage layer 24 and a second, lower region 34 adjacent the substrate/oxide interface 32. The first, upper region 22A comprises a first oxygen concentration and a first nitrogen concentration, and the second region 34 comprises a second oxygen concentration and a second nitrogen concentration, in which the second nitrogen concentration exceeds the first nitrogen concentration. Furthermore, the second nitrogen concentration does not exceed the second oxygen concentration. In one embodiment, as a result of the step of adding, the first concentration does not substantially change.

In another embodiment, following the step of adding nitrogen, by annealing the charge storage layer 24 and the bottom oxide layer 22, the bottom oxide layer 22 comprises a first, upper region 22A having a general formula $Si_xO_yN_{z1}$, wherein x, y and z1 are atomic percentages; and a second, lower region 34 adjacent the substrate/oxide interface, in which the second region 34 comprises a material having a general formula $Si_xO_yN_{z2}$, wherein x, y and z2 are atomic percentages, and y>z2>z1. Thus, the second, lower region 34 includes a higher nitrogen content than the first, upper region 22A, and the oxygen content of both layers exceeds the nitrogen content of both layers. The atomic concentrations of z1 and z2 are substantially the same as disclosed above with respect to the device. In one embodiment, as a result of the step of adding, z1 does not substantially change. In one embodiment, z1 is increased by the step of adding, but to an atomic percent less than z2.

Following the step 1204, in which the charge storage layer 24 and the bottom oxide layer 22 are annealed to add nitrogen to the bottom oxide layer 22, fabrication of the semiconductor device continues, as shown in the final step of FIG. 12. For example, a top oxide layer 26 may be formed on the charge storage layer 24 by a suitable technique. The top oxide layer 26 may be formed by any appropriate method known in the art. The top oxide layer 26 independently may comprise any of the materials disclosed above for the bottom oxide layer 22. For example, the top oxide layer 26 may comprise silicon dioxide, a high-K dielectric material or a composite dielectric material, as defined herein.

In one embodiment, the top oxide layer 26 is thermally grown. In other embodiments, the top oxide layer 26 may be formed by any of the methods described above with respect to formation of the bottom oxide layer 22.

In one embodiment, the top oxide layer 26 is formed by an in-situ steam generation (ISSG) oxidation of the upper surface of the charge storage layer 24. A process for forming a top oxide by ISSG oxidation of a silicon nitride layer is disclosed in commonly assigned, copending U.S. application Ser. No. 10/023,548, filed Dec. 17, 2001, the disclosure of which is hereby incorporated by reference for its teachings relating to ISSG oxidation. In one embodiment, the top oxide layer 26 is formed by an HTO deposition, such as the RTCVD or LPCVD methods described above. In one embodiment, the top oxide layer 26 is deposited by another suitable method, such as PECVD, ALD (ALCVD), PLD, MLD or MOCVD. The CVD method may be any appropriate CVD method known in the art.

Thereafter, following formation of the ONO structure, a layer forming a control gate electrode 28 is formed on the top oxide layer 26, after suitable etching resulting in the stacked-gate structure shown in FIG. 1. The layer forming a control gate electrode 28 may comprise any material known in the art for such use. For example, the control gate electrode layer 28 may comprise polysilicon, polysilicon-germanium, a metal silicide, a metal, or any other suitable material known in the art. A lithographic patterning and etching process may then be carried out to define the stacked-gate structure shown in FIG. 1, including the control gate electrode 28 and the ONO structure.

Following formation of the stacked-gate structure 20, fabrication of the semiconductor device continues, as known in the art.

Nitrogen Addition Prior to Charge Storage Layer Formation.

In one embodiment of the present invention, shown schematically in FIG. 13 as steps 1303 and 1304, N is added to the bottom oxide layer 22 prior to formation of the charge storage layer 24. In accordance with this embodiment of the invention, after formation of the bottom oxide layer 22, one of two alternative methods may be used to add nitrogen to the bottom oxide layer 22 to form the second, lower region 34, leaving the upper region 22A.

Figure 9:
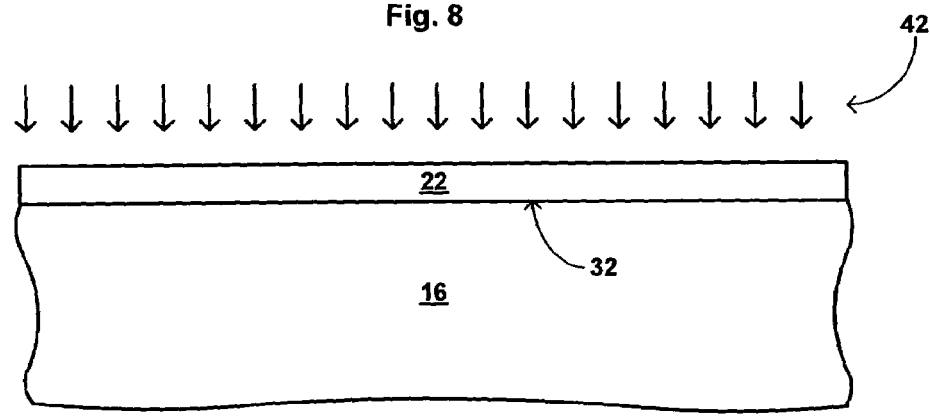
Figure 10:
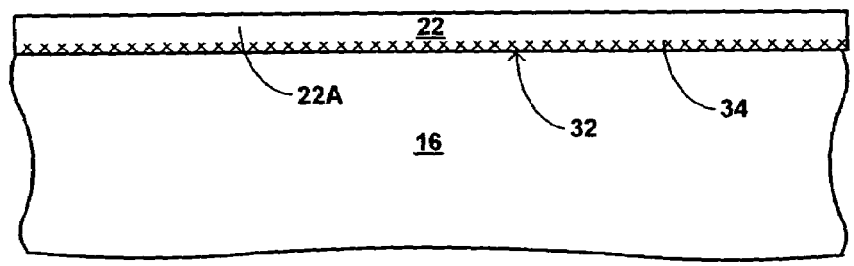
Figure 11:
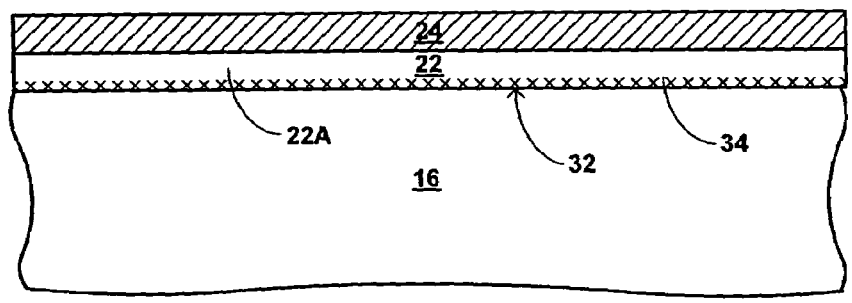

FIG. 9 schematically illustrates a step of adding nitrogen to the bottom oxide layer 22 to form the second region 34 adjacent to the interface 32 to remove silicon-hydrogen bonds and/or dangling silicon bonds. The step of adding is schematically illustrated in FIG. 9 by arrows 42. In one embodiment, identified as step 1303 in FIG. 13, the adding step is carried out by annealing the bottom oxide layer 22 in an atmosphere comprising reactive nitrogen to form the lower region 34 comprising a material referred to as $Si_zO_yN_z$, in which y is greater than z (y>z). In this embodiment, the arrows 42 schematically illustrate the reactive nitrogen entering the bottom oxide layer 22. In another embodiment, identified as step 1304 in FIG. 13, the adding step is carried out by implanting nitrogen atoms or ions, followed by annealing, to form the lower region 34 comprising a material referred to as $Si_zO_yN_z$, in which y is greater than z (y>z). In this embodiment, the arrows 42 schematically illustrate the nitrogen atoms or ions being implanted into the bottom oxide layer 22. Each of the steps 1303 and 1304 are described in more detail in the following.

In the embodiment shown in step 1303, in the adding step, the bottom oxide layer 22 and the interface 32 are annealed in an atmosphere comprising reactive nitrogen. In one embodiment, the annealing in an atmosphere comprising reactive nitrogen is carried out at a suitable temperature and for a suitable time period to form the lower region 34 having a nitrogen content as described above. In one embodiment, the reactive nitrogen is one or more of NO, $N_2O$, $NH_3$ or $NH_2F$. In one embodiment, the annealing conditions are similar to a rapid thermal anneal, except for the presence of the reactive nitrogen. In one embodiment, in the annealing, the bottom oxide layer 22 and the interface 32 are annealed in an atmosphere comprising reactive nitrogen at a temperature in the range from about 200° C. to about 1100° C. In another embodiment, in the annealing, the bottom oxide layer 22 and the interface 32 are annealed in an atmosphere comprising reactive nitrogen at a temperature in the range from about 350° C. to about 700° C. In one embodiment, the temperature of annealing in an atmosphere comprising reactive nitrogen is less than about 500° C. The temperature range and time period range may depend on the properties of the bottom oxide layer, such as its chemical content and its thickness. These ranges may be suitably determined by those of skill in the art.

In one embodiment of step 1303, in the annealing, a RTA is performed for a period ranging from about 5 seconds to about 5 minutes, and in one embodiment, for a period ranging from about 15 seconds to about 60 seconds. In one embodiment, the anneal is performed in a furnace for a period ranging from about 1 minute to about 3 hours, and in one embodiment, for a period ranging from about 30 minutes to about 1 hour.

In one embodiment of step 1303, in the adding step, the atmosphere is substantially 100% of the reactive nitrogen compound. In one embodiment, the atmosphere comprises the reactive nitrogen in a mixture with at least one inert gas. In such embodiment, the ratio of at least one inert gas to reactive nitrogen ranges from about 1:20 to about 20:1, and in another embodiment, the ratio ranges from about 1:10 to about 1:2, and in another, the ratio ranges from about 1:7 to about 1:5. In one embodiment, the atmosphere comprises from about 1% by volume to about 100% by volume of the reactive nitrogen and from about 95% by weight to about 0% by weight of the at least one inert gas. In one embodiment, the atmosphere comprises from about 5% by volume to about 95% by volume of reactive gas and from about 95% by weight to about 5% by weight of the at least one inert gas.

In one embodiment of step 1303, during annealing, the pressure may range from about 1 torr to about 2000 torr. In one embodiment, the pressure is about 760 torr. In one embodiment, the pressure ranges from about 1 torr to about 300 torr. In one embodiment, the pressure is greater than about 760 torr.

In one embodiment, the step 1303 of adding nitrogen is repeated at least one additional time, and in one embodiment, the annealing step is repeated from two to about five times, as deemed necessary.

Following the adding step, fabrication of the semiconductor device continues, as indicated in the final step of FIG. 13.

In the embodiment illustrated in step 1304 of FIG. 13, nitrogen atoms or ions are implanted into the bottom oxide layer 22. In one embodiment, the nitrogen atoms or ions are implanted at a suitable dose and energy to form the lower region 34 having a nitrogen content as described above.

The nitrogen atoms or ions may be implanted by any implantation device known in the art. The present invention is not limited to any particular form of implantation, nor to any particular implantation device. Such devices are well known to those of skill in the art.

The energy of implantation generally ranges from about 2 to about 200 KeV for implantation into a bottom oxide layer 22 having a thickness in the range from about 50 Å to about 500 Å. The exact energy depends, inter alia, the nature and thickness of the bottom oxide layer 22, and the depth to which the nitrogen atom or ions is to be implanted.

In one embodiment, the energy of implantation ranges from about 2 KeV to about 20 KeV. In one embodiment, the energy of implantation ranges from about 20 KeV to about 50 KeV. In one embodiment, the energy of implantation ranges from about 40 KeV to about 100 KeV. In one embodiment, the energy of implantation ranges from about 60 KeV to about 140 KeV. In one embodiment, the energy of implantation ranges from about 120 KeV to about 200 KeV.

Following the implantation, the bottom oxide layer 22 is annealed. The annealing step may be carried out according to the description provided above with respect to annealing the nitrogen-containing charge storage layer 24 in the first embodiment of the invention. The annealing step serves to drive the implanted nitrogen towards the interface 32, thereby assisting in formation and consolidation of the lower, second region 34. Since, as noted above, the purpose of the implantation is to place nitrogen in the lower portion, the implantation is carried out at an energy whereby the implanted nitrogen atoms or ions pass completely through the first, upper layer 22A. As will be understood, such passage may result in damage to the upper layer 22A. The annealing step is believed to assist in correcting any damage to the upper, first region 22A resulting from the implantation.

As a result of the step of adding nitrogen, whether by annealing in an atmosphere comprising reactive nitrogen or by implantation followed by annealing, in one embodiment, the bottom oxide layer 22 comprises a first, upper region 22A adjacent the charge storage layer 24 and a second, lower region 34 adjacent the substrate/oxide interface 32. The first, upper region 22A comprises a first oxygen concentration and a first nitrogen concentration, and the second region 34 comprises a second oxygen concentration and a second nitrogen concentration, in which the second nitrogen concentration exceeds the first nitrogen concentration. Furthermore, the second nitrogen concentration does not exceed the second oxygen concentration. In one embodiment, as a result of the step of adding, the first nitrogen concentration does not substantially change.

In another embodiment, following the step of adding nitrogen, whether by annealing in an atmosphere comprising reactive nitrogen or by implantation followed by annealing, the bottom oxide layer 22 comprises a first, upper region 22A having a general formula $Si_xO_yN_{z1}$, wherein x, y and z1 are atomic percentages; and a second, lower region 34 adjacent the substrate/oxide interface, in which the second region 34 comprises a material having a general formula $Si_xO_yN_{z2}$, wherein x, y and z2 are atomic percentages, and $y>z2>z1$. Thus, the second, lower region 34 includes a higher nitrogen content than the first, upper region 22A, and the oxygen content of both layers exceeds the nitrogen content of both layers. The atomic concentrations of z1 and z2 are substantially the same as disclosed above with respect to the device. In one embodiment, as a result of the step of adding, z1 does not substantially change. In one embodiment, z1 is increased by the step of adding, but to an atomic percent less than z2.

Following the step 1303 or 1304, in which nitrogen is added to the bottom oxide layer 22, fabrication of the semiconductor device continues, as shown in the final step of FIG. 13. For example, a charge storage layer 24 and a top oxide layer 26 may be formed over the bottom oxide layer 22 by suitable techniques. The charge storage layer 24 may be formed by any of the methods described above with respect to the first embodiment. The top oxide layer 26 may be formed by any of the methods described above with respect to the first embodiment. Thereafter, a control gate electrode layer 28 may be deposited on the device, according to any of the methods known in the art. The control gate electrode 28 may comprise any of the materials described above with respect to the first embodiment.

Thereafter, the fabrication of the semiconductor device continues as known in the art.

INDUSTRIAL APPLICABILITY

The present invention provides a solution to problems such as charge loss, dielectric reliability and hot carrier injection induced stress at the interface between a substrate and an overlying oxide layer due to the presence of either or both of silicon-hydrogen bonds which can be converted to dangling silicon bonds, and dangling silicon bonds, by replacing at least a portion of the silicon-hydrogen bonds and/or the dangling silicon bonds, with silicon-nitrogen bonds.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process of fabricating a multi-bit charge trapping dielectric flash memory device, comprising:
   providing a semiconductor substrate;
   forming on the semiconductor substrate a bottom oxide layer having a first side and a second side including a substrate/oxide interface adjacent the semiconductor substrate, wherein the bottom oxide layer comprises a first oxygen concentration and a first nitrogen concentration; and
   adding a quantity of nitrogen to the bottom oxide layer, whereby the bottom oxide layer comprises a first region adjacent the first side and a second region adjacent the substrate/oxide interface, the first nitrogen concentration of the first region does not substantially change, and the second region having a second oxygen concentration and a second nitrogen concentration, wherein the second nitrogen concentration exceeds the first nitrogen concentration, provided that the second nitrogen concentration does not exceed the second oxygen concentration.

2. The process of claim 1, wherein the step of adding comprises at least one of (a) annealing the bottom oxide layer in an atmosphere comprising NO, $N_2O$ or $NH_3$ (b) implanting nitrogen through the bottom oxide followed by annealing, or (c) depositing a nitrogen-containing charge storage layer on the bottom oxide layer to form an ON layer followed by annealing the ON layer.

3. The process of claim 2, wherein the annealing is carried out at a temperature in the range from about 800° C. to about 1150° C.

4. The process of claim 1, wherein the second nitrogen concentration is in the range from about one atomic percent to about 20 atomic percent.

5. The process of claim 1, wherein the first nitrogen concentration is in a range from zero to about 20 atomic percent.

6. The process of claim 1, wherein as a result of the step of adding, the first nitrogen concentration does not substantially change.

7. The process of claim 1, wherein prior to the step of adding, the second region comprises a first number of unsatisfied silicon dangling bonds and silicon-hydrogen bonds and as a result of the step of adding, the first number is reduced to a second number, the second number being smaller than the first number.

8. A process of fabricating a multi-bit charge trapping dielectric flash memory device, comprising:
   providing a semiconductor substrate;
   forming on the semiconductor substrate a bottom oxide layer having a first side and a second side including a substrate/oxide interface adjacent the semiconductor substrate, wherein the bottom oxide layer comprises a material having a general formula $Si_xO_yN_{z1}$, wherein x, y and z1 are atomic percentages; and
   adding a quantity of nitrogen to the bottom oxide layer, whereby the bottom oxide layer comprises a fist region adjacent the first side and a second region adjacent the substrate/oxide interface, whereby z1 does not substantially change in the first region and the second region comprises a material having a general formula $Si_xO_yN_{z2}$, wherein x, y and z2 are atomic percentages, and y>z2>z1.

9. The process of claim 8, wherein the step of adding a quantity of nitrogen comprises at least one of (a) annealing the bottom oxide layer in an atmosphere comprising NO, $N_2O$ or $NH_3$ (b) implanting nitrogen through the bottom oxide followed by annealing, or (c) depositing a nitrogen-containing charge storage layer on the bottom oxide layer to form an ON layer and annealing the ON layer.

10. The process of claim 9, wherein the annealing is carried out at a temperature in the range from about 800° C. to about 1150° C.

11. The process of claim 8, wherein z2 is in the range from about one atomic percent to about 20 atomic percent.

12. The process of claim 8, wherein following the step of adding, in the first region the values of x, y and z1 remain substantially unchanged.

13. The process of claim B, wherein z1 is in a range from zero to about 20 atomic percent.

14. The process of claim 8, wherein prior to the step of adding, the second region comprises a first number of unsatisfied silicon dangling bonds and silicon-hydrogen bonds and as a result of the step of adding, the first number is reduced to a second number, the second number being smaller than the first number.

15. A charge trapping dielectric flash memory device, comprising:
   a semiconductor substrate having an upper surface;
   a bottom oxide layer having a lower surface, the bottom oxide layer formed on the upper surface of the substrate, whereby a substrate/oxide interface is defined by the upper surface and the lower surface; and
   a charge trapping dielectric charge storage layer over the bottom oxide layer,
   wherein the bottom oxide layer comprises a first region adjacent the charge storage layer and a second region adjacent the substrate/oxide interface, the first region comprising a material having a general formula $Si_xO_yN_{z1}$, the second region comprising a material having a general formula $Si_xO_yN_{z2}$, wherein x, y, z1 and z2 are atomic percentages, and y>z2>z1 wherein z1 is in a range from zero to about 20 percent.

16. The device of claim 15, wherein z2 is in the range from about one atomic percent to about 20 atomic percent.

17. The device of claim 15, wherein the charge trapping dielectric material layer comprises a nitride or a high-K dielectric material or a mixture or composite thereof.

18. The device of claim 15 wherein the bottom oxide layer comprises silicon dioxide or a high-K dielectric material or a mixture or composite thereof.

19. The device of claim 15, wherein the bottom oxide layer has a total thickness, and the second region has a thickness equivalent to about 10% to about 50% of the total thickness.

* * * * *

UNITED STATES PATENT AND TRADEMARK OFFICE
CERTIFICATE OF CORRECTION

PATENT NO. : 6,958,511 B1
DATED : October 25, 2005
INVENTOR(S) : Halliyal et al.

It is certified that error appears in the above-identified patent and that said Letters Patent is hereby corrected as shown below:

Title page,
Item [56], References Cited, insert:
-- FOREIGN PATENT DOCUMENTS
JP-A 1032001740 --.

Column 8,
Line 37, replace "insulator (SOD semiconductor" with -- insulator (SOI) semiconductor --.

Column 18,
Line 6, replace "a fist region" with -- a first region --.
Line 28, replace "claim B, wherein" with -- claim 8, wherein --.
Line 52, replace "about 20 percent." with -- about 20 atomic percent. --.

Signed and Sealed this

Seventeenth Day of January, 2006

JON W. DUDAS
*Director of the United States Patent and Trademark Office*